United States Patent
Li et al.

(10) Patent No.: US 9,023,271 B2
(45) Date of Patent: May 5, 2015

(54) THIN FILM OF COPPER—NICKEL—MOLYBDENUM ALLOY AND METHOD FOR MANUFACTURING THE SAME

(71) Applicant: Dalian University of Technology, Dalian (CN)

(72) Inventors: Xiaona Li, Dalian (CN); Xinyi Zhang, Dalian (CN); Jin Zhu, Dalian (CN); Qing Wang, Dalian (CN); Chuang Dong, Dalian (CN)

(73) Assignee: Dalian University of Technology, Dilian (CN)

( * ) Notice: Subject to any disclaimer, the term of this patent is extended or adjusted under 35 U.S.C. 154(b) by 201 days.

(21) Appl. No.: 13/751,142

(22) Filed: Jan. 27, 2013

(65) Prior Publication Data

US 2013/0136650 A1    May 30, 2013

Related U.S. Application Data

(63) Continuation-in-part of application No. PCT/CN2010/077695, filed on Oct. 13, 2010.

(51) Int. Cl.
| | |
|---|---|
| *C22C 9/00* | (2006.01) |
| *C22C 9/06* | (2006.01) |
| *C23C 14/18* | (2006.01) |
| *C23C 14/16* | (2006.01) |
| *C23C 14/58* | (2006.01) |

(52) U.S. Cl.
CPC ... *C22C 9/00* (2013.01); *C22C 9/06* (2013.01); *C23C 14/185* (2013.01); *C23C 14/165* (2013.01); *C23C 14/5806* (2013.01)

(58) Field of Classification Search
None
See application file for complete search history.

(56) References Cited

U.S. PATENT DOCUMENTS

| | | | | |
|---|---|---|---|---|
| 4,975,333 A | * | 12/1990 | Johnson et al. | 428/570 |
| 2007/0257323 A1 | * | 11/2007 | Tsui et al. | 257/382 |

FOREIGN PATENT DOCUMENTS

| | | | | |
|---|---|---|---|---|
| JP | 2003-094553 A | * | 4/2003 | |
| JP | 2003-286596 A | * | 10/2003 | |
| JP | 2004-193546 A | * | 7/2004 | |

OTHER PUBLICATIONS

Machine translation of JP-2003-286596A (no date available).*
Machine translation of JP-2003-094553A (no date available).*
Machine translation of JP-2004-193546A (no date available).*

* cited by examiner

*Primary Examiner* — Kiley Stoner
(74) *Attorney, Agent, or Firm* — Muncy, Geissler, Olds & Lowe, P.C.

(57) ABSTRACT

A Cu—Ni—Mo alloy thin film, including Ni as a solution element and Mo as a diffusion barrier element. Ni and Mo are co-doped with Cu. The enthalpy of mixing between Mo and Cu is +19 kJ/mol, and the enthalpy of mixing between Mo and Ni is −7 kJ/mol. The atomic fraction of Mo/Ni is within the range of 0.06-0.20 or the weight faction of Mo/Ni within the range of 0.10-0.33. The total amount of Ni and Mo additions is within the range of 0.14-1.02 at. % or wt. %. A method for manufacturing the alloy thin film is also provided.

2 Claims, No Drawings

THIN FILM OF COPPER—NICKEL—MOLYBDENUM ALLOY AND METHOD FOR MANUFACTURING THE SAME

CROSS-REFERENCE TO RELATED APPLICATIONS

This application is a continuation-in-part of International Patent Application No. PCT/CN2010/077695 with an international filing date of Oct. 13, 2010, designating the United States, now pending, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a Cu—Ni—Mo alloy thin film and method for manufacturing the same.

2. Description of the Related Art

Cu possesses good electric conductivity and resistivity against electromigration, and is used as interconnect metal for ultra-large scale integrated circuits. However, Cu reacts easily with Si or silica at low temperatures about 200° C. To avoid device failure of this kind, a diffusion barrier layer should be introduced to inhibit the inter-diffusion. With the ever decreasing device size, the barrier layer thickness should be reduced consequently. In accordance with international semiconductor roadmap, for 32 and 22 nm interconnect techniques, the barrier thickness should be 7 and 4 nm only. Conventional diffusion barrier layer of such a thickness faces a big challenge to maintain the barrier property and a high thermal stability.

Alternatively, the Cu seed layer can be alloyed for such a purpose, avoiding the use of barrier layer technique. Properly selecting the elements and their quantities might retard Cu—Si reaction and thus minimize the rise of electrical resistivity due to alloying.

Early research chose doping elements that have strong chemical affinity with oxygen such as Mg and Al. After annealing, a thin passivation layer is formed on the film and at the interface. However such a passivation layer is rather thick, about 20 nm, which is not suitable for Cu interconnect down to 45 nm There are two major problems in the present Cu alloys for barrierless interconnect.

1. The doping involves mainly insoluble elements of large atomic sizes. Though the doped elements are prone to precipitate and effectively decrease electrical resistivity, the secondary phase precipitation stabilizes the defect structures in the as-deposited state that increases electrical scattering. This is why the film resistivity cannot be decreased to the desired level.

2. The doping quantity is not known. Too small doping cannot effectively enhance diffusion barrier; excessive doping increases resistivity significantly. Adding two or more elements has not been tried, and a theoretical guidance is quite needed.

SUMMARY OF THE INVENTION

In view of the above-described problems, it is one objective of the invention to provide a Cu—Ni—Mo alloy film with high thermal stability and low electrical resistivity.

The invention selects Ni as a main alloying element, which is completely soluble with a Cu matrix. At the same time an appropriate amount of large-size and diffusion barrier element Mo is added to prepare the Cu—Ni—Mo alloy film. The film is subsequently annealed. Electrical properties and thermal stabilities are measured. Since the designed solid solution alloy possesses high thermal stability and low chemical reactivity, precipitation is avoided; at the same time, the full solution of diffusion inhibiting Mo is introduced. It is then anticipated that such an alloyed film is diffusion inhibiting and thermally stable simultaneously.

To achieve the above objective, in accordance with one embodiment of the invention, there is provided a Cu—Ni—Mo alloy thin film. Ni serves as a main solution element and Mo is added as a diffusion barrier element. The enthalpy of mixing between Mo and Cu is +19 kJ/mol, and it is −7 kJ/mol between Mo and Ni. Without Ni, Mo has a near-zero solubility in Cu.

In the Cu—Ni—Mo alloy, Mo/Ni proportion is within the range of 0.06-0.20 (atomic faction) or 0.10-0.33 (weight faction); the total amount of Mo and Ni is 0.14-1.02% (atom or weight percent).

A method for manufacturing the Cu—Ni—Mo alloy thin film comprises the following steps:

1. preparation of an alloy sputtering target, the preparation comprising:
   1.1) weighing pure metals of Ni and Mo, the purities of Ni and Mo being above 99%;
   1.2) placing a mixture of the pure metals in a water-cooled Cu crucible of an arc melting furnace and melting the mixture using vacuum non-consumed electric arc melting in the presence of Ar; pumping the crucible to $10^{-2}$ Pa and filling with Ar to reach a pressure of 0.03±0.01 MPa, controlling a melting current at 150±10 A/cm$^2$, melting, maintaining a melting state for another 10 seconds, cooling a resulting Ni—Mo alloy ingot in the crucible to room temperature, reversing the ingot for a remelting, repeating above steps for at least three times to reach composition homogeneity;
   1.3) placing the Ni—Mo alloy ingot into a water-cooled Cu crucible equipped with a negative-pressured suction casting system; pumping the crucible to $10^{-2}$ Pa and filling with Ar to reach a pressure of 0.03±0.01 MPa, controlling a melting current at 150±10 A/cm$^2$, melting, maintaining a melting state for another 10 seconds, starting the negative-pressured suction casting system to produce a pressure difference of 0.01±0.005 MPa, filling a resulting alloy melt into a cylindrical copper mold, cooling to room temperature to yield cast rods with diameters of 3 mm and 6 mm;
   1.4) cutting the cast rods into thin slices of 1 mm in thickness;
   1.5) adhering the thin slices using conductive silver glue onto Cu targets with a purity of 99.999% to yield the alloy sputtering target;
2. preparation of an alloyed Cu film, the preparation comprising:
   2.1) employing a Si (100) wafer as a substrate, cleaning the substrate in an ultrasonic bath of acetone, ethanol, and de-ionized water, submerging the wafer in 5% HF for 2-3 minute, and drying with $N_2$;
   2.2) placing the alloy sputtering target and wafer into a vacuum chamber, pumping with a rotary pump to less than 5 Pa, and then vacuuming to $5.4 \times 10^{-4}$ Pa using a molecular pump; and 2.3) filling the vacuum chamber with Ar to a pressure of 2 Pa, igniting a glow discharge, regulating Ar flow at 8.0 sccm, working pressure at 0.4 Pa, sputtering power at 75 W, substrate-target distance to 10 cm, and sputtering time for 25 min, and cooling the vacuum chamber for 30 min to collect the alloy thin film.

Advantages of the invention are summarized as follows
1) The co-doping of Cu-soluble Ni and Cu-insoluble Mo and their quantities in the present barrierless Cu alloy film are the results of a theoretical guidance, incorporating factors such as enthalpies of mixing, cluster structure, and atomic size.
2) The co-doping renders the Cu alloy thin film with a high thermal stability. After an annealing of 400° C. /40 h, easy grain growth during annealing annihilates defects so that the electrical resistivity is maintained at a low level.
3) The amount of diffusion barrier element Mo is large reduced, down to 0.02 at % (0.03 wt %), which positive reduces the loss of electrical conductivity due to solute scattering.

DETAILED DESCRIPTION OF THE EMBODIMENTS

For further illustrating the invention, experiments detailing a Cu—Ni—Mo alloy thin film and method for manufacturing the same are described below. It should be noted that the following examples are intended to describe and not to limit the invention.

Below is described the preparation procedures and the characterization of an alloy thin film of $Cu_{99.73}Ni_{0.25}Mo_{0.02}$ (at. %)=$Cu_{99.74}Ni_{0.23}Mo_{0.03}$ (wt. %).

1. Preparation of Composite Alloy Target

In accordance with the designed composition, Mo and Ni metal ingredients with purities above 99% are weighed and the Mo—Ni mixture is placed in a water-cooled Cu crucible. The melting is conducted in the presence of Ar using non-consumed arc melting. The crucible is pumped to $10^{-2}$ Pa, and then filled with Ar to a pressure of 0.03±0.01 MPa, with melting current being controlled at about 150±10 A/cm². After melting for 10 seconds, the electrical current is shut off and the ingot is cooled to room temperature in the crucible. The melting is carried out at least three times to reach high composition homogeneity. The ingot is finally suction cast into a cylindrical copper mold with a diameter of 3 or 6 mm, under a negative pressure difference of 0.01±0.005 MPa. The Ni—Mo alloy rod is cut into slices with a thickness of 1 mm, which are then adhered to a base 5 N Cu sputtering target using conductive silver glue.

2. Si Wafer Cleaning

Si (100) wafer is used as the substrate. It is cleaned in ultrasonic bath of acetone, ethanol, and de-ionized water. The cleaned wafer is submerged in 5% HF for 2-3 minutes, and then dried with $N_2$ gas before being placed in vacuum chamber.

3. Vacuum Setup of the Magnetron Sputtering System

The chamber is pumped with a rotary pump down to 5 Pa and then is vacuumed to $5.4 \times 10^{-4}$ Pa using a molecular pump.

4. Sputtering Deposition

Fill the chamber with Ar to a pressure of 2 Pa and ignite a glow discharge. Then regulate Ar flow to 8.0 sccm and the working pressure to 0.4 Pa, using sputtering power 75 W and substrate-target distance 10 cm. The substrate is not intentionally heated or cooled. The sputtering continues for 25 min. After sputtering the chamber is cooled for 30 min before taking out the Cu alloy thin film.

After transmission electron microscopy examination on the cross-section of the thus prepared film, the film is about 300 nm in thickness. To prevent the sample from being oxidized, the sample is cooled in the chamber for at least 30 min before being taken out.

5. Annealing

The annealing is conducted in high vacuum, above $7 \times 10^{-4}$ Pa. The heating rate is 1° C./s and the samples are cooled to room temperature in the furnace. The annealing schemes are 400° C./1 h, 500° C./1 h, 600° C./1 h, and 400° C./40 h. In the last annealing scheme, the 40 hours are separated into 5 cycles, each being 8 hours.

6. Characterization

Compositions are analyzed using Shimadzu EPMA-1600; microstructure is examined by Bruke D8 discover XRD, Philips Technal $G^2$ TEM. Electrical resistivity is measured using a duel four-point probe.

According to EPMA, the composition of the obtained thin film was $Cu_{99.73}Ni_{0.25}Mo_{0.02}$ (at. %)=$Cu_{99.74}Ni_{0.23}Mo_{0.03}$ (wt. %). The total amount of alloying element is 0.27 at. %.

XRD revealed single FCC phase for the samples annealed at 400° C., 500° C., and 600° C. for 1 h, free of copper silicide. After the long 400° C./40 h annealing, no silicide peaks were detected, signifying that the Cu—Ni—Mo films showed excellent thermal stabilities. Moreover, by comparing the XRD patterns before and after the annealings, it is seen that 1) the FWHM is significantly reduced, reflecting intensive grain growth, which is quite different from single doping with insoluble elements like Mo and Ru, and 2) there is no obvious peak shift, signifying that even after annealing the doped elements do not precipitated from the Cu matrix.

According to TEM examinations, the as-deposited film showed typical columnar structure, with column width of about 20-30 nm A thin native $SiO_2$ layer of 3-5 nm thick existed between the film and the Si substrate. A cross-sectional view on the 400° C./1 h sample revealed a smooth, homogeneous, and pore- and silicide-free interface. The columnar structure complete disappeared and inside the film twin bands as large as 700 nm can be seen, signifying extensive grain growth, in agreement with XRD result.

The sheet resistivity after four-point probe is measured ten times for each sample and the average value is taken. The film thickness is taken from TEM observation and equation $\rho = \square \times d$ ($\mu\Omega$-cm) is used to calculate the resistivity. As shown in Table 1,

TABLE 1

Electrical resistivity of Cu—Ni—Mo films annealed at different temperature

| Sample state | As-deposited | 400° C./ 1 h | 500° C./ 1 h | 600° C./ 1 h | 400° C./ 40 h |
|---|---|---|---|---|---|
| Electrical resistivity ($\mu\Omega$-cm) | 6.0 | 2.6 | 2.5 | 2.7 | 2.8 | with the rising of annealing temperature, $\rho$ first decreased and then increased, with the low point being at 500° C./1 h, about 2.5 $\mu\Omega$-cm. $\rho$ increased slightly upon the higher temperature annealing 600° C./1 h, about 2.7 $\mu\Omega$-cm. At 400° C. annealing for 40 h, the resistivity still maintains a low level, about 2.8 $\mu\Omega$-cm. Then it has been confirmed that the designed solid solution Cu film is highly stable and is quite effective in inhibiting Cu—Si inter-diffusion, while satisfying a fairly low electrical resistivity.

The above experiment took Ni and Mo co-alloying as the example to show that the Ni—Mo co-alloyed Cu film can be good candidate for barrierless interconnect material, possessing sufficiently high thermal stability and low electrical resistivity, which satisfies the demand from the IT industries.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A Cu—Ni—Mo alloy thin film, comprising: Ni as a solution element, Mo as a diffusion barrier element, and Cu; wherein
   Ni and Mo are co-doped with Cu;
   an enthalpy of mixing between Mo and Cu is +19 kJ/mol, and an enthalpy of mixing between Mo and Ni is −7 kJ/mol;
   an atomic fraction of Mo/Ni is within the range of 0.06-0.20 or a weight faction of Mo/Ni within the range of 0.10-0.33; and
   a total amount of Ni and Mo additions is within the range of 0.14-1.02 expressed in atom percent (at. %) or weight percent (wt. %).

2. A method for manufacturing the alloy thin film of claim 1, the method comprising the steps of:
   1) preparation of an alloy sputtering target, said preparation comprising:
      a) weighing pure metals of Ni and Mo, purities of Ni and Mo being above 99%;
      b) placing a mixture of said pure metals in a water-cooled Cu crucible of an arc melting furnace and melting said mixture using vacuum non-consumed electric arc melting in the presence of Ar; pumping said crucible to $10^{-2}$ Pa and filling with Ar to reach a pressure of 0.03±0.01 MPa, controlling a melting current at 150±10 A/cm$^2$, melting, maintaining a melting state for another 10 seconds, cooling a resulting Ni—Mo alloy ingot in said crucible to room temperature, reversing said ingot for a remelting, repeating above steps for at least three times to reach composition homogeneity;
      c) placing said Ni—Mo alloy ingot into a water-cooled Cu crucible equipped with a negative-pressured suction casting system; pumping said crucible to $10^{-2}$ Pa and filling with Ar to reach a pressure of 0.03±0.01 MPa, controlling a melting current at 150±10 A/cm$^2$, melting, maintaining a melting state for another 10 seconds, starting said negative-pressured suction casting system to produce a pressure difference of 0.01±0.005 MPa, filling a resulting alloy melt into a cylindrical copper mold, cooling to room temperature to yield cast rods with diameters of 3 mm and 6 mm;
      d) cutting said cast rods into thin slices of 1 mm in thickness;
      e) adhering said thin slices using conductive silver glue onto Cu targets with a purity of 99.999% to yield said alloy sputtering target;
   2) preparation of an alloyed Cu film, said preparation comprising:
      f) employing a Si (100) wafer as a substrate, cleaning said substrate in an ultrasonic bath of acetone, ethanol, and de-ionized water, submerging said wafer in 5% HF for 2-3 minute, and drying with $N_2$;
      g) placing said alloy sputtering target and wafer into a vacuum chamber, pumping with a rotary pump to less than 5 Pa, and then vacuuming to $5.4 \times 10^{-4}$ Pa using a molecular pump; and
      h) filling said vacuum chamber with Ar to a pressure of 2 Pa, igniting a glow discharge, regulating Ar flow at 8.0 sccm, working pressure at 0.4 pa, sputtering power at 75 W, substrate-target distance to 10 cm, and sputtering time for 25 min, and cooling said vacuum chamber for 30 min to collect said alloy thin film.

* * * * *